US012715019B2

(12) United States Patent
Tanaka et al.

(10) Patent No.: US 12,715,019 B2
(45) Date of Patent: Aug. 25, 2026

(54) METHOD OF PRODUCING GAS BARRIER LAMINATE, GAS BARRIER LAMINATE, PACKAGING FILM, PACKAGING CONTAINER, AND PACKAGING PRODUCT

(71) Applicant: TOPPAN HOLDINGS INC., Tokyo (JP)

(72) Inventors: Ayumi Tanaka, Tokyo (JP); Kaoru Furuta, Tokyo (JP); Mikinori Yamada, Tokyo (JP); Takeshi Nishikawa, Tokyo (JP); Miki Fukugami, Tokyo (JP)

(73) Assignee: TOPPAN HOLDINGS INC., Tokyo (JP)

( * ) Notice: Subject to any disclaimer, the term of this patent is extended or adjusted under 35 U.S.C. 154(b) by 0 days.

(21) Appl. No.: 18/787,875

(22) Filed: Jul. 29, 2024

(65) Prior Publication Data

US 2024/0383003 A1 Nov. 21, 2024

Related U.S. Application Data

(63) Continuation of application No. PCT/JP2023/000061, filed on Jan. 5, 2023.

(30) Foreign Application Priority Data

Jan. 31, 2022 (JP) ................................ 2022-012538
Jan. 31, 2022 (JP) ................................ 2022-012539

(51) Int. Cl.
*B32B 15/04* (2006.01)
*B05D 3/02* (2006.01)
(Continued)

(52) U.S. Cl.
CPC ............ *B05D 7/02* (2013.01); *B05D 3/0227* (2013.01); *B05D 7/54* (2013.01); *B65D 65/42* (2013.01);
(Continued)

(58) Field of Classification Search
CPC ........................................................ C08J 7/048
(Continued)

(56) References Cited

U.S. PATENT DOCUMENTS 11,397,293 B1 * 7/2022 Masschelein ........ G02B 6/0065
12,371,236 B2 * 7/2025 Nishikawa ............ B65D 65/42
(Continued)

FOREIGN PATENT DOCUMENTS

JP H09-192593 A 7/1997
JP H09-290477 A 11/1997
(Continued)

OTHER PUBLICATIONS

WO2020129291 English machine translation (Year: 2020).*
(Continued)

*Primary Examiner* — Lauren R Colgan
(74) *Attorney, Agent, or Firm* — Foley & Lardner LLP

(57) ABSTRACT

A production method including: a step of forming, on a substrate layer containing a polypropylene resin or a polyester resin, a metal oxide layer by a vacuum film forming process; a step of applying a gas barrier coating layer-forming composition on the metal oxide layer to form a coating film; a step of preheating the coating film by infrared radiation; and a step of heating and thereby curing the coating film preheated by infrared radiation in an atmosphere at 50 to 120° C. to form a gas barrier coating layer, in which the gas barrier coating layer-forming composition contains at least one selected from the group consisting of an alkyl silicon alkoxide and its hydrolysate, and a water-soluble polymer.

17 Claims, 3 Drawing Sheets

(51) Int. Cl.

| | |
|---|---|
| ***B05D 7/00*** | (2006.01) |
| ***B05D 7/02*** | (2006.01) |
| ***B32B 17/06*** | (2006.01) |
| ***B65D 65/42*** | (2006.01) |
| ***C23C 14/10*** | (2006.01) |
| ***C23C 14/24*** | (2006.01) |

(52) U.S. Cl.
CPC .............. *C23C 14/10* (2013.01); *C23C 14/24* (2013.01); *B05D 2320/00* (2013.01)

(58) Field of Classification Search
USPC .......................................................... 428/702
See application file for complete search history.

(56) References Cited

U.S. PATENT DOCUMENTS

| | | | | |
|---|---|---|---|---|
| 2007/0224402 | A1* | 9/2007 | Yoshida | B32B 27/308 428/447 |
| 2010/0035050 | A1* | 2/2010 | Okawara | C08J 7/052 428/339 |
| 2011/0236660 | A1* | 9/2011 | Murakami | B32B 27/286 428/213 |
| 2014/0170424 | A1* | 6/2014 | Honda | B32B 33/00 427/331 |
| 2019/0023468 | A1* | 1/2019 | Ishii | B65D 65/40 |
| 2022/0153006 | A1* | 5/2022 | Tanaka | B32B 27/32 |
| 2022/0396870 | A1 | 12/2022 | Suzuki et al. | |
| 2022/0411598 | A1* | 12/2022 | Kaminaga | C08J 7/048 |
| 2023/0047527 | A1 | 2/2023 | Tanaka | |
| 2023/0053232 | A1* | 2/2023 | Fukugami | B32B 1/08 |
| 2023/0257172 | A1* | 8/2023 | Nishikawa | C08J 7/043 428/515 |
| 2023/0258980 | A1* | 8/2023 | Fukugami | G02B 5/206 428/216 |

FOREIGN PATENT DOCUMENTS

| | | | |
|---|---|---|---|
| JP | H10-329286 | A | 12/1998 |
| JP | 2009006582 | * | 1/2009 |
| JP | 2009-154449 | A | 7/2009 |
| JP | 2017-177685 | A | 10/2017 |
| JP | 2019-119132 | A | 7/2019 |
| JP | 2021-041620 | A | 3/2021 |
| JP | 2021-151791 | A | 9/2021 |
| JP | 2022-118091 | A | 8/2022 |
| WO | WO-2020/129291 | A1 | 6/2020 |
| WO | WO-2021/020400 | A1 | 2/2021 |
| WO | WO-2021/176824 | A1 | 9/2021 |
| WO | WO-2021/220935 | A1 | 11/2021 |
| WO | WO-2021/220977 | A1 | 11/2021 |
| WO | WO-2022/085586 | A1 | 4/2022 |

OTHER PUBLICATIONS

JP2009006582 English machine translation (Year: 2009).*

European Extended Search Report issued in corresponding European Patent Application No. 23746610.7 dated Mar. 31, 2025.

International Searching Authority, "International Search Report," issued in connection with International Patent Application No. PCT/JP2023/000061, dated Apr. 11, 2023.

International Searching Authority "Written Opinion," issued in connection with International Patent Application No. PCT/JP2023/000061, dated Apr. 11, 2023.

Office Action issued in corresponding Japanese Patent Application No. 2022-012538 dated Jun. 28, 2022 (14 pages).

* cited by examiner

METHOD OF PRODUCING GAS BARRIER LAMINATE, GAS BARRIER LAMINATE, PACKAGING FILM, PACKAGING CONTAINER, AND PACKAGING PRODUCT

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2023/000061, filed on Jan. 5, 2022, which is based upon and claims the benefit to Japanese Patent Application No. 2022-012538 filed on Jan. 31, 2022 and to Japanese Patent Application No. 2022-012539 filed on Jan. 31, 2022, the disclosures of all which are incorporated herein by reference in their entirety.

BACKGROUND

Technical Field

The present disclosure relates to a method of producing a gas barrier laminate, a gas barrier laminate, a packaging film, a packaging container, and a packaging product.

Background Art

Packaging containers such as packaging bags used for packaging food products, pharmaceutical products, and others are required to have gas barrier properties to block intrusion of water vapor, oxygen, and other gases that may degrade contents, in order to suppress degradation, decay, and the like of contents and retain their functions and characteristics. Therefore, a gas barrier laminate has been conventionally used in these packaging bags.

A gas barrier laminate generally includes a substrate layer, a metal oxide layer, and a gas barrier coating layer in this order, and the gas barrier coating layer is formed by coating the metal oxide layer with a gas barrier coating layer-forming composition that can impart gas barrier functions and curing the coat.

For example, PTL 1 described below discloses a barrier film including a barrier coat layer, an inorganic oxide deposited layer, and a substrate layer in this order, in which the barrier coat layer is formed by coating with a gas barrier composition (barrier coat liquid) and thereafter heating and drying the coat at high temperatures of 140° C. to 200° C.

CITATION LIST

Patent Literature

PTL 1: JP 2021-041620 A.

SUMMARY OF THE INVENTION

Technical Problem

However, when a barrier film is prepared by the method according to PTL 1 described above, wrinkling tends to occur in the substrate layer, and cracks are likely to occur in the barrier coat layer, in response to an external force being applied. Such a barrier film has a room for improvement in appearance and barrier performance.

The present disclosure has been made in view of the above-described circumstances and has as its object to provide a method of producing a gas barrier laminate by which a gas barrier laminate having good appearance and barrier performance can be produced. The present disclosure also has as its object to provide a gas barrier laminate, a packaging film, a packaging container, and a packaging product.

Solution to Problem

An aspect of the present disclosure is a method of producing a gas barrier laminate, the method including: a step of forming, on a substrate layer containing a polypropylene resin or a polyester resin, a metal oxide layer by a vacuum film forming process; a step of applying a gas barrier coating layer-forming composition on the metal oxide layer to form a coating film; a step of preheating the coating film by infrared radiation; and a step of heating and thereby curing the coating film preheated by infrared radiation in an atmosphere at 50 to 120° C. to form a gas barrier coating layer, in which the gas barrier coating layer-forming composition contains at least one selected from the group consisting of an alkyl silicon alkoxide and its hydrolysate and a water-soluble polymer.

According to the above-described production method, the gas barrier coating layer can be uniformly cured without applying as high a level of heat as in conventional technology to the entire laminate, in forming the gas barrier coating layer. This suppresses occurrence of wrinkling in the substrate layer and also suppresses excessive curing of only the surface of the gas barrier coating layer. Therefore, a gas barrier laminate having good appearance and barrier performance can be produced.

In an aspect of the production method of the present disclosure, the gas barrier coating layer-forming composition may further contain a silane coupling agent. This can improve adhesion between the gas barrier coating layer and the metal oxide layer and facilitates suppression of intralayer peeling in the gas barrier laminate.

An aspect of the present disclosure is to provide a gas barrier laminate including a substrate layer containing a polypropylene resin or a polyester resin, a metal oxide layer, and a gas barrier coating layer, in this order, in which a surface of the gas barrier coating layer has a hardness of 0.15 GPa or more and less than 1.10 GPa as measured by a nanoindentation method.

Such a gas barrier laminate can be a gas barrier laminate which is produced by the above-described production method, suppresses wrinkling in the substrate layer, includes a gas barrier coating layer having excellent crack resistance, and has good appearance and barrier performance.

In an aspect of the gas barrier laminate of the present disclosure, the gas barrier coating layer may have a composite modulus of elasticity of 11 GPa or less. In this case, it can be said that the gas barrier laminate has excellent abuse resistance.

In an aspect of the gas barrier laminate of the present disclosure, the gas barrier laminate may further include an anchor coat layer between the substrate layer and the metal oxide layer. In this case, the smoothness of the surface of the anchor coat layer improves more than the smoothness of the surface of the substrate layer. This can uniformize the thickness of the metal oxide layer and can further improve gas barrier properties of the gas barrier laminate.

In an aspect of the gas barrier laminate of the present disclosure, the metal oxide layer may contain at least one of an aluminum oxide and a silicon oxide. This can further improve the gas barrier properties.

An aspect of the present disclosure provides a packaging film including the above-described gas barrier laminate and a sealant layer. Since this packaging film includes the above-described gas barrier laminate, a film having good appearance and barrier performance can be obtained.

An aspect of the present disclosure provides a packaging container including the above-described packaging film. Since this packaging container includes the above-described packaging film, a container having good appearance and barrier performance can be obtained.

An aspect of the present disclosure provides a packaging product including the above-described packaging container and contents filled in the above-described packaging container. Since this packaging product includes the above-described packaging container having good appearance and barrier performance, visibility of the contents is excellent, and the reduction in quality of the contents caused by ingress of oxygen can be suppressed for a long period.

Advantageous Effects of the Invention

According to the present disclosure, there can be formed a gas barrier coating layer that is excellent in crack resistance while suppressing occurrence of wrinkling in the substrate layer. That is, according to the present disclosure, there is provided a method of producing a gas barrier laminate, by which a gas barrier laminate having good appearance and barrier performance can be produced. Further, according to the present disclosure, there are provided a gas barrier laminate, a packaging film, a packaging container, and a packaging product.

DETAILED DESCRIPTION

Figure 1:
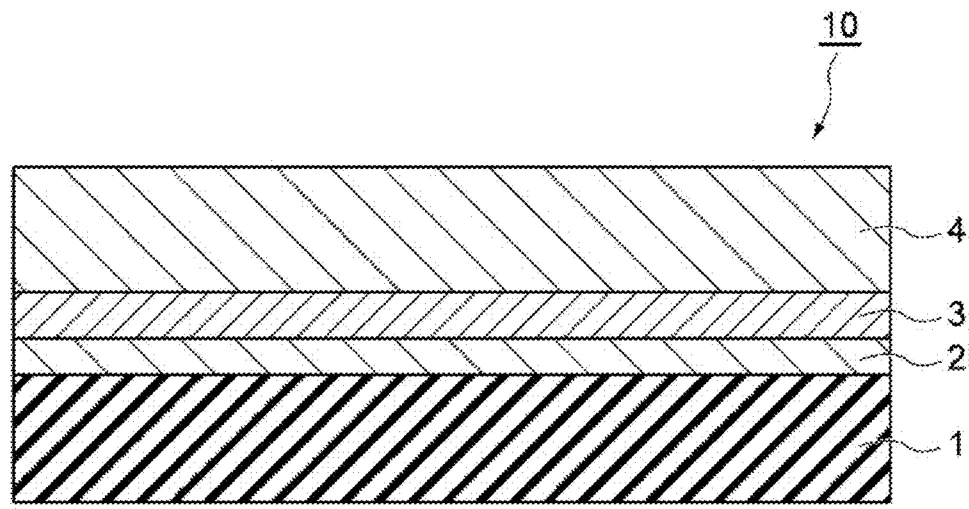
FIG. 1 is a cross-sectional view illustrating an embodiment of a gas barrier laminate of the present disclosure.

Hereinafter, embodiments of the present disclosure will be described in detail. However, the present invention is not limited to the following embodiments.

<Method of Producing Gas Barrier Laminate>

A method of producing a gas barrier laminate includes: a step of forming, on a substrate layer containing a polypropylene resin or a polyester resin, a metal oxide layer by a vacuum film forming process; a step of applying a gas barrier coating layer-forming composition on the metal oxide layer to form a coating film; a step of preheating the coating film by infrared radiation; and a step of heating and accordingly curing the coating film preheated by infrared radiation in an atmosphere of 50 to 120° C. to form a gas barrier coating layer. The above-described production method may further include, prior to the step of forming a metal oxide layer, a step of forming, on the substrate layer containing a polypropylene resin or a polyester resin, an anchor coat layer, as necessary.

Hereinafter, an example of the method of producing a gas barrier laminate will be described.

First, a substrate layer containing a polypropylene resin or a polyester resin is prepared.

Next, an anchor coat layer is formed on one surface of the substrate layer.

Specifically, one surface of the substrate layer is coated with an anchor coat layer-forming composition for forming an anchor coat layer, and the coat is heated and dried to form an anchor coat layer. The heating temperature is, for example, 50 to 120° C., and the heating time is, for example, about 10 seconds to 10 minutes.

Next, a metal oxide layer is formed on the anchor coat layer.

The metal oxide layer can be formed by a vacuum film forming process. Examples of the vacuum film forming process include a physical vapor deposition process and a chemical vapor deposition process. Examples of the physical vapor deposition process include a vacuum deposition process, a sputtering deposition process, and an ion plating process. As the physical vapor deposition process, a vacuum deposition process is particularly preferably used. Examples of the vacuum deposition process include a resistance heating type vacuum deposition process, an electron beam (EB) heating type vacuum deposition process, and an induction heating type vacuum deposition process. Examples of the chemical vapor deposition process include a thermal CVD process, a plasma CVD process, and an optical CVD process.

Next, a gas barrier coating layer is formed on the metal oxide layer.

The gas barrier coating layer can be formed by, for example, coating the metal oxide layer with a gas barrier coating layer-forming composition and curing the obtained coating film. As described above, the gas barrier coating layer-forming composition contains at least one selected from the group consisting of an alkyl silicon alkoxide and its hydrolysate, a water-soluble polymer, and, as necessary, a silane coupling agent.

Here, "curing the coating film" specifically denotes curing a solid content contained in the coating film. "Solid content is cured" denotes that an alkyl silicon alkoxide or its hydrolysate and a water-soluble polymer, or an alkyl silicon alkoxide or its hydrolysate, a water-soluble polymer, and a silane coupling agent, react with each other and are unified.

As a method for coating with the gas barrier coating layer-forming composition, a known method can be adopted. Specific examples of the coating method include wet film-forming methods such as a gravure coating method, a dip coating method, a reverse coating method, a wire bar coating method, and a die coating method.

Although the thickness of the coating film is not particularly limited as long as a desired gas barrier coating layer is obtained, it may be, for example, 700 nm or less. When the thickness of the coating film is 700 nm or less, preheating by infrared radiation is more easily uniformized compared to when the thickness of the coating film exceeds 700 nm. However, from the viewpoint of improving gas barrier properties of the formed barrier coating layer, the thickness of the coating film is more preferably 100 nm or more and particularly preferably 200 nm or more.

The coating film is firstly preheated by infrared radiation. Infrared radiation is performed prior to heating and curing the coating film by hot air or the like, mainly in order to suppress surface roughness, preliminarily supply a heat quantity to the entirety of the coating film in a uniform manner such that the entire coating film is uniformly dried, and suppress a thermal load on the substrate film.

Since drying (heating) by hot air is excellent as a measure to dry and cure the coating film but is a drying system using convective heat transfer, surface roughness is likely to occur on the coating film. Further, since drying proceeds from the surface of the coating film, a concentration gradient of a solvent (aqueous medium) is likely to occur in the thickness direction of the coating film. This causes a phenomenon called skinning in which a concentrated layer is formed on the surface of the coating film so that the solvent inside the coating film is not volatilized and is likely to remain. Especially, when a water-soluble polymer such as PVA is used as a solute, its high moisture retention and film-forming properties are likely to cause skinning. When the surface of the coating film shrinks due to skinning, not only wrinkling and curling occur in the coating film, but also heating unevenness occurs on the surface of and inside the coating film. Since such heating unevenness is likely to increase the hardness of the surface of the gas barrier coating layer and decrease the interior hardness, cracking is likely to occur in response to an external force such as bending, pulling, and heat shock in a retort. The occurrence of cracks leads to deterioration of barrier properties.

On the other hand, heating by infrared radiation (drying by infrared radiation) is a drying system using radiative heat transfer, and surface roughness is unlikely to occur in the coating film. Further, the coating film can be uniformly heated in its thickness direction by infrared radiation. Therefore, performing preheating by infrared radiation prior to drying by hot air can inhibit the occurrence of skinning and suppress wrinkling and curling in the coating film and the substrate film. Further, reducing occurrence of heating unevenness facilitates a more uniform hardness of the gas barrier coating layer (inhibits hardening of only the surface) and inhibits the occurrence of cracking in response to external force, compared to in the above-described skinning state. Furthermore, in heating by infrared radiation, a thermal load on the substrate film can be suppressed due to more strongly promoting volatilization of the solvent than temperature increase of the coating film, when energy is supplied to the coating film. Energy supplied through heating by infrared radiation is used for the temperature increase of the coating film and the volatilization of the solvent. When energy supply to volatilization of the solvent is dominant, the volatilization latent heat of the solvent takes thermal energy from the coating film. When the drying speed by heating by infrared radiation is rapid, and drying is efficiently performed, the heating of the coating film and the volatilization latent heat are balanced so that the coating film does not increase in temperature (called constant-rate drying). Since a low temperature state is thus maintained not only in the coating film but also in the substrate film below the coating film, a thermal load on the substrate film can be suppressed.

Preheating by infrared radiation can be performed using, for example, an infrared dryer such as an infrared heater (far-infrared heater). The condition of the infrared heater is preferably, for example, a center wavelength of 4 to 30 μm (far-infrared). As the infrared radiation, any of far-infrared radiation, mid-infrared radiation, and near-infrared radiation can be adopted. However, far-infrared radiation is preferable, because many solvents have an absorption spectrum in the range of far-infrared radiation. Further, when the solvent is water, induction heating by high frequencies or microwaves can also be used.

From the viewpoint of giving sufficient heat quantity to the entirety of the coating film, the preheating temperature can be 40° C. or higher and preferably 50° C. or higher. Further, from the viewpoint of suppressing a thermal load on the substrate film, the preheating temperature can be 70° C. or lower and preferably 60° C. or lower. The preheating temperature is the temperature of the surface of the coating film measured by a non-contact surface thermometer (for example, a radiation thermometer FT3700 manufactured by Hioki E.E. Corporation).

From the above-described viewpoints, the preheating time can be 3 seconds or more and preferably 5 seconds or more, and can be 15 seconds or less and preferably 10 seconds or less.

It can be said that the coating film subjected to the preheating step is in a state in which the amount of the solvent decreases while a certain low temperature state is maintained as described above. For curing the solid content contained in the coating film (for example, for dehydrating and condensing a silanol group), it is necessary to increase the temperature of the coating film itself to a prescribed temperature.

Specifically, the coating film can be cured by heating the coating film under a prescribed temperature atmosphere by hot air heating or the like. The hot air heating can be performed using, for example, a jet nozzle type dryer. The heating temperature and the heating time are set so as to suppress deformation (for example, thermal shrinkage) of the substrate layer and concurrently perform curing of the solid content in the gas barrier coating layer-forming composition and removal of liquid such as an aqueous medium. From the viewpoint of performing curing of the solid content in the gas barrier coating layer-forming composition and removal of liquid such as an aqueous medium, the heating temperature is 50° C. or higher, but is preferably 60° C. or higher and more preferably 80° C. or higher. Further, from the viewpoint of suppressing deformation (for example, thermal shrinkage) of the substrate layer, the heating temperature is 120° C. or lower, but is preferably 110° C. or lower.

From viewpoints similar to those described above, the heating time is preferably 3 seconds or more, more preferably 5 seconds or more, and further preferably 10 seconds or more, and preferably 10 minutes or less, more preferably 5 minutes or less, and further preferably 3 minutes or less.

The gas barrier laminate is obtained in the above-described manner.

<Gas Barrier Laminate>

FIG. 1 is a cross-sectional view illustrating an embodiment of the gas barrier laminate of the present disclosure. In FIG. 1, a gas barrier laminate 10 includes a substrate layer 1 containing a polypropylene resin or a polyester resin, a metal oxide layer 3, and a gas barrier coating layer 4, in this order. The gas barrier coating layer 4 has a hardness of 0.15 GPa or more and less than 1.10 GPa as measured by a nanoindentation method. It is noted that the gas barrier laminate 10 may have an anchor coat layer 2 between the substrate layer 1 and the metal oxide layer 3.

It can be said that this gas barrier laminate 10 is a gas barrier laminate which suppresses occurrence of wrinkling in the substrate layer and has good appearance and barrier performance.

Hereinafter, the substrate layer 1, the anchor coat layer 2, the metal oxide layer 3, and the gas barrier coating layer 4 will be described in detail.

(Substrate Layer)

The substrate layer 1 is a layer to serve as a support body of the gas barrier coating layer 4 and contains a polypropylene resin. Since the substrate layer 1 contains a polypropylene resin, for example, recycling properties of a packaging film obtained by laminating with non-stretched polypropylene (CPP) are improved. The substrate layer 1 is not particularly limited as long as it substantially contains a polypropylene resin, and the polypropylene resin may be either a homopolypropylene or a polypropylene copolymer. The content ratio of the polypropylene resin, with respect to the total amount of the substrate layer 1, may be 99.5 mass % or more. The substrate layer 1 may contain, as a minor component, an additive agent such as an antistatic agent, an ultraviolet absorber, a plasticizer, or a lubricant. For improving adhesion with a layer to be laminated, the substrate layer 1 may be subjected to a surface treatment such as a plasma treatment.

The substrate layer 1 may contain a polyester (-based) resin. When the substrate layer 1 contains a polyester resin, heat resistance of the gas barrier laminate improves. The substrate layer 1 is not particularly limited as long as it substantially contains a polyester resin, and examples of the polyester resin include a polyethylene terephthalate resin (PET), a polybutylene terephthalate resin (PBT), a polyethylene terephthalate resin (PEN), and a polybutylene naphthalate resin (PBN). Examples of the PET include virgin PET that is newly synthesized from a raw material such as petroleum and recycled PET that is a reproduced PET. The PET product to be recycled may include waste PET bottles. Examples of recycled PET include PET reproduced by mechanical recycling and PET reproduced by chemical recycling. Part of the terephthalic acid of the PET may be modified into phthalic acid. The content ratio of the polyester resin, with respect to the total amount of the substrate layer 1, may be 99.5 mass % or more. The substrate layer 1 may contain, as a minor component, an additive agent such as an antistatic agent, an ultraviolet absorber, a plasticizer, or a lubricant. For improving adhesion with a layer to be laminated, the substrate layer 1 may be subjected to a surface treatment such as a plasma treatment.

The substrate layer 1 may be a stretched film or a non-stretched film, but is preferably a stretched film from the viewpoint of oxygen barrier properties. Here, the stretched film includes a uniaxially stretched film and a biaxially stretched film, but is preferably a biaxially stretched film in order to improve heat resistance.

The thickness of the substrate layer 1 is not particularly limited, but is, for example, 0.1 mm or less. Particularly, the thickness of the substrate layer 1 is preferably 40 μm or less, more preferably 35 μm or less, and particularly preferably 30 μm or less. When the thickness of the substrate layer 1 is 0.1 mm or less, flexibility of the gas barrier laminate 10 can be further improved, and oxygen gas barrier properties of the gas barrier laminate 10 after abuse can be further improved, compared to when the thickness of the substrate layer 1 exceeds 0.1 mm. However, from the viewpoint of improving strength, the thickness of the substrate layer 1 is preferably 10 μm or more and more preferably 12 μm or more.

(Anchor Coat Layer)

The anchor coat layer 2 is a layer for improving adhesion between the substrate layer 1 and the metal oxide layer 3 and is disposed between the substrate layer 1 and the metal oxide layer 3.

A material constituting the anchor coat layer 2 is not particularly limited as long as it can improve adhesion between the substrate layer 1 and the metal oxide layer 3, but an example of such a material is a reactant of an organosilane or an organic metal compound, a polyol compound, and an isocyanate compound. That is, it can also be said that the anchor coat layer 2 is a urethane-based adhesive layer. Examples of the organosilane include a trifunctional organosilane or a hydrolysate of a trifunctional organosilane. An example of the organic metal compound is a metal alkoxide or a hydrolysate of a metal alkoxide. The metal element contained in the organic metal compound may be, for example, Al, Ti, Zr, or the like. The hydrolysate of an organosilane and the hydrolysate of a metal alkoxide each have at least one hydroxyl group. From the viewpoint of transparency, the polyol compound is preferably an acrylic polyol. The isocyanate compound mainly functions as a crosslinking agent or a curing agent. The polyol compound and the isocyanate compound may be a monomer or a polymer.

The thickness of the anchor coat layer 2 is not particularly limited as long as it has a thickness that can improve adhesion between the substrate layer 1 and the metal oxide layer 3, but is preferably 30 nm or more. In this case, compared to when the thickness of the anchor coat layer 2 is less than 30 nm, smoothness of the surface of the anchor coat layer 2 can be improved more than that of the surface of the substrate layer 1, which enables the thickness of the metal oxide layer 3 to be more uniform and oxygen barrier properties to be further improved. Therefore, oxygen barrier properties of the gas barrier laminate 10 can be further improved. The thickness of the anchor coat layer 2 is more preferably 40 nm or more and further preferably 50 nm or more. When the thickness of the anchor coat layer 2 is increased, the reduction in water vapor barrier properties in response to an applied external force such as stretching can be further suppressed. The thickness of the anchor coat layer 2 is preferably 300 nm or less. In this case, compared to when the thickness of the anchor coat layer 2 exceeds 300 nm, flexibility of the gas barrier laminate 10 can be further improved, and oxygen gas barrier properties of the gas barrier laminate 10 after abuse can be more improved. The thickness of the anchor coat layer 2 is more preferably 200 nm or less.

(Metal Oxide Layer)

The metal oxide layer 3 is a layer that contains a metal oxide. With the metal oxide layer 3, gas barrier properties of the gas barrier laminate 10 can be improved more.

An example of the metal constituting the metal oxide is at least one atom selected from the group consisting of Si, Al, Mg, Sn, Ti, and In. The metal oxide is preferably $SiO_x$ or $AlO_x$ (a silicon oxide or an aluminum oxide), from the viewpoint of water vapor barrier properties. Especially, the metal oxide is preferably $SiO_x$. In this case, the gas barrier laminate 10 can have more excellent water vapor barrier properties.

The metal oxide layer 3 may include a single layer or multiple layers.

The thickness of the metal oxide layer 3 is not particularly limited, but is preferably 5 nm or more. In this case, oxygen barrier properties of the gas barrier laminate 10 improve more compared to when the thickness of the metal oxide layer 3 is less than 5 nm. The thickness of the metal oxide layer 3 is more preferably 8 nm or more and particularly preferably 10 nm or more.

Further, the thickness of the metal oxide layer 3 is preferably 80 nm or less. In this case, compared to when the thickness of the metal oxide layer 3 exceeds 80 nm, flexibility of the gas barrier laminate 10 can improve more, and oxygen barrier properties of the gas barrier laminate 10 after abuse can be improved more. Further, oxygen barrier properties of the gas barrier laminate 10 after a retort treatment can also be improved more. The thickness of the metal oxide layer 3 is more preferably 70 nm or less and particularly preferably 60 nm or less.

(Gas Barrier Coating Layer)

The gas barrier coating layer 4 is constituted by a cured body of the gas barrier coating layer-forming composition. That is, it can be said that the gas barrier coating layer 4 is a thermally cured product of a composition that contains at least one selected from the group consisting of an alkyl silicon alkoxide and its hydrolysate, and a water-soluble polymer.

The gas barrier coating layer 4 has a hardness of 0.15 GPa or more and less than 1.10 GPa as measured by a nanoindentation method. The hardness being 0.15 GPa or more means that curing of the solid content in the gas barrier coating layer-forming composition and removal of liquid such as an aqueous medium have been sufficiently performed. Further, the hardness being 0.15 GPa or more suppresses offset caused by the layer being excessively soft while ensuring necessary barrier properties, which facilitates formation of a uniform layer. Furthermore, since heat shock resistance improves, deterioration caused by a retort treatment or the like is unlikely to occur.

On the other hand, the hardness being less than 1.10 GPa means that during heating to cure the solid content in the gas barrier coating layer-forming composition and remove liquid such as an aqueous medium, excessive heat was not applied to the substrate layer, which suppresses deformation (for example, thermal shrinkage) of the substrate layer. Further, since the hardness is less than 1.10 GPa, excessive hardening of the layer is suppressed, and abuse resistance is improved.

The hardness of the gas barrier coating layer 4 is preferably 0.20 GPa or more and more preferably 0.50 GPa or more. Further, the hardness of the gas barrier coating layer 4 is preferably 1.05 GPa or less, more preferably 1.0 GPa or less, and further preferably 0.7 GPa or less.

The composite modulus of elasticity of the gas barrier coating layer 4 is preferably 11 GPa or less. In this case, it can be said that the gas barrier laminate has excellent abuse resistance. The composite modulus of elasticity of the gas barrier coating layer 4 is more preferably 10 GPa or less, further preferably 9 GPa or less, and particularly preferably 7 GPa. The lower limit of the composite modulus of elasticity is not particularly limited, but can be 2 GPa or 6 GPa from the viewpoint of barrier properties.

The hardness and composite modulus of elasticity of the gas barrier coating layer 4 are measured by a nanoindentation method. The nanoindentation method is a measurement method in which a quasi-static indentation test is performed on a target measurement object to obtain mechanical properties of a sample.

A measurement sample (cross-section sample) is prepared in the following manner. That is, both surfaces of the gas barrier laminate are subjected to a corona treatment and thereafter embedded in a visible light curing resin D-800. Then, an ultramicrotome Leica EM UC7 is used to vertically cut the gas barrier laminate in the lamination direction using a MicroStar LH diamond knife. The exposed cross section is subjected to a finishing treatment under the conditions of a cutting thickness Feed of 100 nm and a cutting speed Speed of 1 mm/s to obtain a measurement sample.

Measurement is performed using a Hysitron TI-Premier (trade name) manufactured by Bruker Japan K.K as a measurement device and a Berkovich type diamond indenter manufactured by Bruker Japan K.K. as an indenter. Measurement conditions are as follows.

Temperature: normal temperature (25° C.)

Mode: load control mode

Indenting and unloading: indenting at an indentation rate of 1.5 μN/sec to a load of 15 μN, thereafter maintaining the maximum load for 5 seconds, and thereafter unloading at a rate of 1.5 μN/sec.

Measurement location: obtaining a shape image of the cross section of the gas barrier coating layer by a shape measuring function of a measurement device for scanning the surface of a sample with an indenter and selecting 20 locations at intervals of 1 μm or more on the cross section of the gas barrier coating layer from the shape image.

In calculating the hardness and composite modulus of elasticity, fused quartz is used as a reference sample to previously calibrate the relationship between the contact depth and the contact projected area of the indenter and the sample. Thereafter, an unloading curve in the region of 60 to 95% with respect to the maximum load during unloading is analyzed by an Oliver-Pharr method to calculate the hardness and composite modulus of elasticity.

The gas barrier coating layer-forming composition contains at least one selected from the group consisting of an alkyl silicon alkoxide and its hydrolysate, and a water-soluble polymer.

The alkyl silicon alkoxide is represented by general formula (1) $Si(OR^1)_4$ below.

$$Si(OR^1)_4 \quad (1)$$

In general formula (1), $R^1$ represents an alkyl group. Examples of the alkyl group include a methyl group and an ethyl group. Among these, an ethyl group is preferable. In this case, the alkyl silicon alkoxide is tetraethoxysilane and is relatively stable in aqueous solvent after hydrolysis.

The content ratio of the (at least one selected from the group consisting of) alkyl silicon alkoxide (and its hydrolysate) in the solid content is not particularly limited, but is preferably 8 mass % or more, more preferably 15 mass % or more, particularly preferably 20 mass % or more, and further preferably 30 mass % or more, 40 mass % or more, or 45 mass % or more, when the alkyl silicon alkoxide is converted into $SiO_2$. When the content ratio of the alkyl silicon alkoxide in the solid content is 8 mass % or more, oxygen gas barrier properties and adhesion of the gas barrier laminate after heat sterilization treatment can be further improved, compared to when the content ratio of the alkyl silicon alkoxide in the solid content is less than 8 mass %.

The content ratio of the alkyl silicon alkoxide in the solid content is preferably 80 mass % or less, more preferably 78 mass % or less, and particularly preferably 75 mass % or less. When the content ratio of the alkyl silicon alkoxide in the solid content is 80 mass % or less, oxygen gas barrier properties of the gas barrier laminate after abuse can be further improved, compared to when the content ratio of the alkyl silicon alkoxide in the solid content exceeds 80 mass %.

Examples of the water-soluble polymer include a polyvinyl alcohol resin, modified forms thereof, and a polyacrylic acid. These can be used individually or in combination of two or more. Among these, a polyvinyl alcohol resin or modified forms thereof are preferable as the water-soluble polymer. In this case, this composition, when cured, can impart more excellent gas barrier properties to the gas barrier laminate 10. Further, this composition can impart more excellent flexibility to the gas barrier laminate 10 and further improve oxygen barrier properties after abuse, even when cured.

When the water-soluble polymer is constituted by a polyvinyl alcohol resin or modified forms thereof, the saponification degree of the water-soluble polymer is not particularly limited, but is preferably 95% or more and may be 100%, from the viewpoint of improving gas barrier properties of the gas barrier laminate 10.

The polymerization degree of the water-soluble polymer is not particularly limited, but is preferably 300 or more, from the viewpoint of improving gas barrier properties of the gas barrier laminate 10. The polymerization degree of the water-soluble polymer is preferably 450 to 2400.

The content ratio of the water-soluble polymer in solid content is preferably 20 mass % or more, more preferably 22 mass % or more, and particularly preferably 25 mass % or more. When the content ratio of the water-soluble polymer in the solid content is 20 mass % or more, oxygen gas barrier properties of the gas barrier laminate after abuse can be improved more, compared to when the content ratio of the water-soluble polymer in the solid content is less than 20 mass %.

The content ratio of the water-soluble polymer in the solid content is preferably 92 mass % or less, more preferably 85 mass % or less, particularly preferably 80 mass % or less, and further preferably 70 mass % or less, 60 mass % or less, or 55 mass % or less. When the content ratio of the water-soluble polymer in the solid content is 92 mass % or less, interlayer adhesion in the gas barrier laminate 10 after retort treatment can be improved more, compared to when the content ratio of the water-soluble polymer in the solid content exceeds 92 mass %.

The gas barrier coating layer-forming composition may further include, as a curing agent, a silane coupling agent.

The silane coupling agent is not particularly limited, but is preferably at least one selected from the group consisting of a silicon compound represented by general formula (2) below and its hydrolysate.

$$(R^2Si(OR^3)_3)_n \quad (2)$$

In the above-described general formula (2), $R^2$ represents a monovalent organic functional group, and $R^3$ represents an alkyl group or $—C_2H_4OCH_3$.

In this case, adhesion between the gas barrier coating layer 4 and the metal oxide layer 3 can be improved, and interlayer peeling (delamination) in the gas barrier laminate 10 can be suppressed.

It is noted that $R^2$ and $R^3$ may be the same as or different from each other. $R^3$'s may be the same as or different from each other.

Examples of the monovalent organic functional group represented by $R^2$ include a monovalent organic functional group that contains a vinyl group, an epoxy group, a mercapto group, an amino group, or an isocyanate group. Among these, an isocyanate group is preferable as the monovalent organic functional group. In this case, the composition, when cured, can have more excellent hot water resistance and impart higher laminate strength to the gas barrier laminate 10 even after retort treatment.

Examples of the alkyl group represented by $R^3$ include a methyl group and an ethyl group. Among these, a methyl group is preferable. In this case, hydrolysis proceeds rapidly.

n represents an integer of 1 or more. The silane coupling agent represents a monomer when n is 1, while the silane coupling agent represents a multimer when n is 2 or more. n is preferably 3. In this case, hot water resistance of the gas barrier coating layer 4 can be more improved, and higher laminate strength can be imparted to the gas barrier laminate 10 even after retort treatment.

Examples of the silane coupling agent include a silane coupling agent having a vinyl group such as vinyltrimethoxysilane and vinyltriethoxysilane; a silane coupling agent having an epoxy group such as 3-glycidoxypropyltrimethoxysilane, 3-glycidoxypropyltriethoxysilane, 3-glycidoxypropylmethyldimethoxysilane, and 3-glycidoxypropylethyl diethoxysilane; a silane coupling agent having a mercapto group such as 3-mercaptopropyltrimethoxysilane and 3-mercaptopropylmethyldimethoxysilane; a silane coupling agent having an amino group such as 3-aminopropyltrimethoxysilane and 3-aminopropyltriethoxysilane; and a silane coupling agent having an isocyanate group such as 3-isocyanatopropyltriethoxysilane and 1,3,5-tris(3-methoxysilylpropyl)isocyanurate. These silane coupling agents may be used individually or in combination of two or more.

The content ratio of the silane coupling agent in the solid content is not particularly limited, but is preferably 1 mass % or more, more preferably 2 mass % or more, and particularly preferably 5 mass % or more. In this case, compared to when the content ratio of the silane coupling agent in the solid content is less than 1 mass %, higher laminate strength can be imparted to the gas barrier laminate 10 when cured, even after retort treatment.

The content ratio of the silane coupling agent in the solid content is preferably 20 mass % or less, more preferably 18 mass % or less, particularly preferably 15 mass % or less, and further preferably 10 mass % or less. In this case, compared to when the content ratio of the silane coupling agent in the solid content exceeds 20 mass %, bleed-out of the silane coupling agent is less likely to occur, and contamination of the surface is suppressed.

It is noted that, for example, when the silane coupling agent is represented by general formula (2) described above, the content ratio of the silane coupling agent in the solid content is calculated by converting the mass of the silane coupling agent into the mass of $R^2Si(OH)_3$.

(Other Components in Solid Content)

The solid content may further contain, as necessary, known additive agents such as a dispersant, a stabilizer, a viscosity modifier, and a colorant to an extent that does not impair gas barrier properties of the gas barrier coating layer 4.

(Total Content Ratio of Components in Solid Content)

The total content ratio of the alkyl silicon alkoxide or its hydrolysate, the water-soluble polymer, and the silane coupling agent in the solid content is not particularly limited, but is usually 95 mass % or more and preferably 97 mass % or more, and may be 100 mass %.

(Liquid)

As a liquid in which the above-described solid content is dissolved and dispersed, an aqueous medium is usually used. Examples of the aqueous medium include water, a hydrophilic organic solvent, and a mixture thereof. Examples of the hydrophilic organic solvent include alcohols such as methanol, ethanol, and isopropanol; ketones such as acetone and methyl ethyl ketone; ethers such as tetrahydrofuran; cellosolves; carbitols; and nitriles such as acetonitrile. These can be used individually or in combination of two or more.

As the aqueous medium, an aqueous medium containing only water or an aqueous medium containing water as a main component is preferable. When the aqueous medium contains water as a main component, the content ratio of water in the aqueous medium is preferably 70 mass % or more and more preferably 80 mass % or more.

The thickness of the gas barrier coating layer 4 is not particularly limited, but is preferably 50 nm or more.

In this case, compared to when the thickness of the gas barrier coating layer 4 is less than 50 nm, oxygen barrier properties of the gas barrier laminate 10 improve more.

From the viewpoint of improving gas barrier properties, the thickness of the gas barrier coating layer 4 is more preferably 100 nm or more and particularly preferably 200 nm or more.

On the other hand, the thickness of the gas barrier coating layer 4 is preferably 700 nm or less. Compared to when the thickness of the gas barrier coating layer 4 exceeds 700 nm, flexibility of the gas barrier laminate 10 can improve more, and oxygen barrier properties of the gas barrier laminate 10 after abuse can be improved more. Further, oxygen barrier properties of the gas barrier laminate 10 after a retort treatment can also be improved more.

From the viewpoint of more improving flexibility of the gas barrier laminate 10, the thickness of the gas barrier coating layer 4 is more preferably 500 nm or less and particularly preferably 400 nm or less.

<Packaging Film>

Next, an embodiment of the packaging film of the present disclosure will be described with reference to FIG. 2. It is noted that in FIG. 2, constituents identical to those in FIG. 1 are assigned with identical reference signs, and duplicated descriptions will be omitted.

Figure 2:
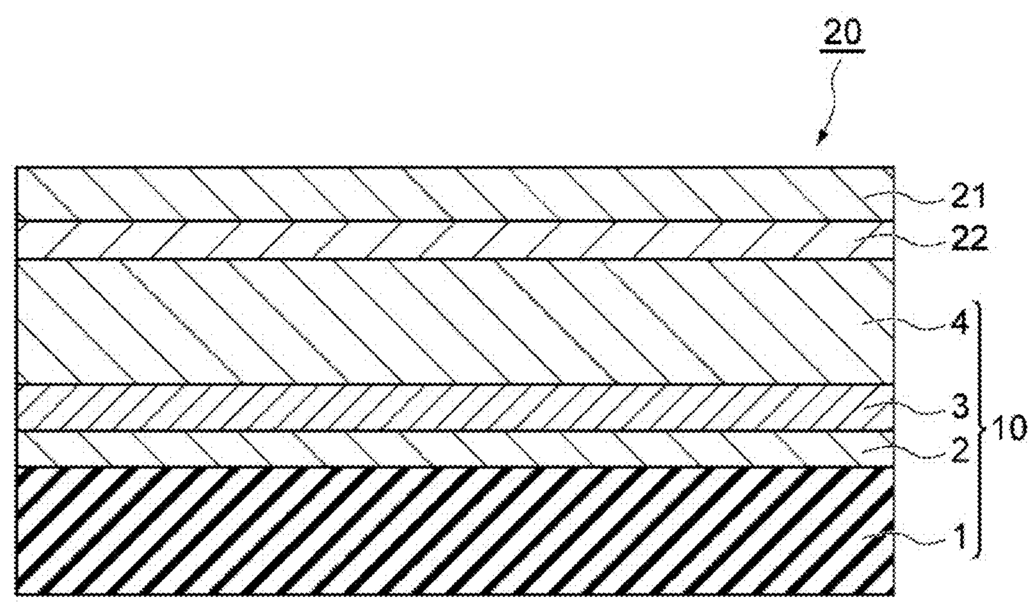
FIG. 2 is a cross-sectional view illustrating an embodiment of a packaging film of the present disclosure.

FIG. 2 is a cross-sectional view illustrating an embodiment of the packaging film of the present disclosure. As illustrated in FIG. 2, a packaging film 20 includes a gas barrier laminate 10 and a sealant layer 21 laminated to the gas barrier laminate 10, in which the sealant layer 21 is disposed on the gas barrier coating layer 4 side of the substrate layer 1 of the gas barrier laminate 10. As illustrated in FIG. 2, the gas barrier laminate 10 may be configured such that the gas barrier coating layer 4 and the sealant layer 21 adhere to each other via an adhesive layer 22.

Since this packaging film 20 includes the above-described gas barrier laminate 10, it can be said that it is a film having good appearance and barrier performance.

Examples of the material of the adhesive layer 22 include a polyester-isocyanate-based resin, a urethane resin, and a polyether-based resin. For using the packaging film 20 for a retort application, a two-component curable urethane-based adhesive agent having resistance to retort treatment can be preferably used.

(Sealant Layer)

Examples of the material of the sealant layer 21 include thermoplastic resins such as a polyolefin resin and a polyester resin, but a polyolefin resin is commonly used. Specifically, examples of the polyolefin resin include ethylene-based resins such as a low-density polyethylene resin (LDPE), a medium-density polyethylene resin (MDPE), a linear low-density polyethylene resin (LLDPE), an ethylene-vinyl acetate copolymer (EVA), an ethylene-α olefin copolymer, and an ethylene-(meth)acrylic acid copolymer, polypropylene-based resins such as a homopolypropylene resin (PP), a propylene-ethylene random copolymer, a propylene-ethylene block copolymer, and a propylene-α olefin copolymer, and a mixture thereof. The material of the sealant layer 21 can be appropriately selected from the above-described thermoplastic resins, according to the usage application and the temperature conditions of a boiling treatment, retort treatment, and the like.

The thermoplastic resin constituting the sealant layer 21 may be stretched or non-stretched, but is preferably not stretched (for example, CPP) from the viewpoint of lowering a melting point to facilitate heat sealing.

The thickness of the sealant layer 21 is appropriately determined according to the mass of contents, the shape of a packaging bag, and others and not particularly limited, but 30 to 150 μm is preferable from the viewpoint of flexibility and adhesiveness of the packaging film 20.

<Packaging Product>

Figure 3:
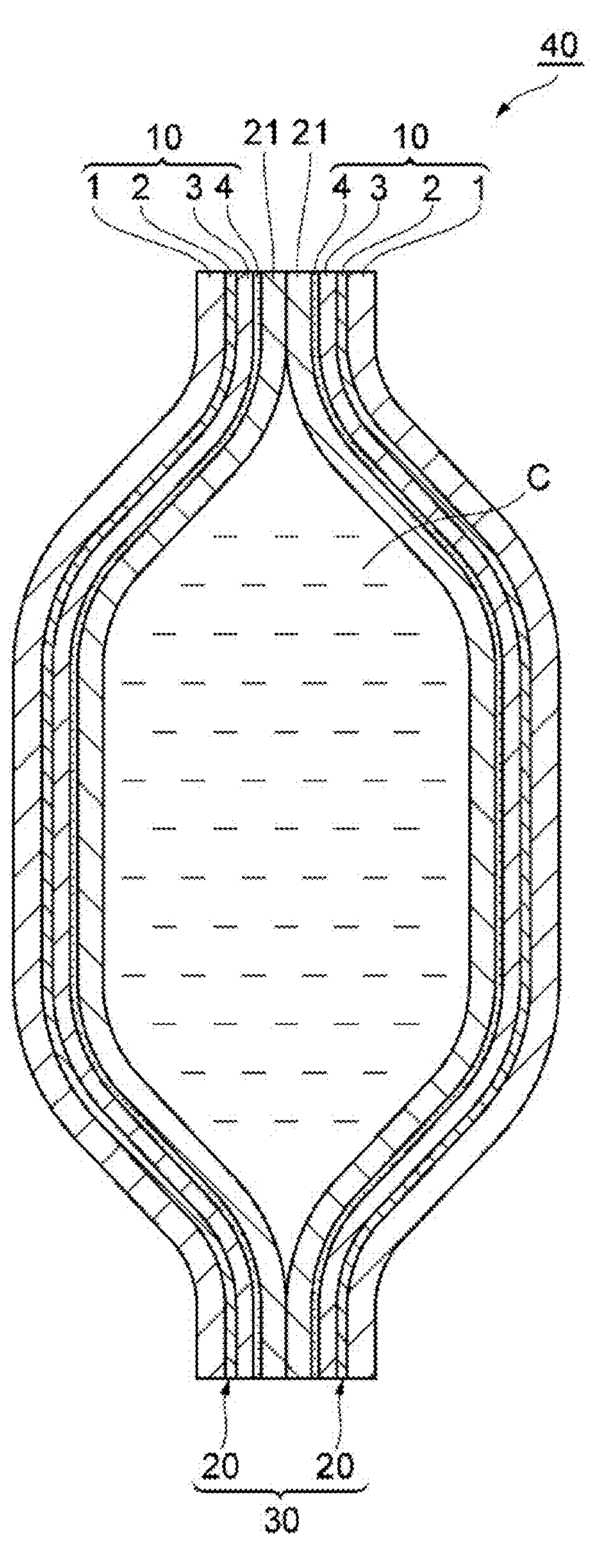
FIG. 3 is a side view illustrating an embodiment of a packaging product of the present disclosure.

Next, an embodiment of the packaging product of the present disclosure will be described with reference to FIG. 3. It is noted that FIG. 3 is a side view illustrating an embodiment of the packaging product of the present disclosure. In FIG. 3, constituents identical to those in FIG. 1 or FIG. 2 are assigned with identical reference signs, and duplicated description will be omitted.

As illustrated in FIG. 3, a packaging product 40 includes a container 30 and contents C charged in the packaging container 30. The packaging container 30 illustrated in FIG. 3 is obtained by using a pair of packaging films 20 to heat-seal marginal portions of the packaging films 20 with sealant layers 21 facing each other. It is noted that in FIG. 3, the adhesive layer 22 of the packaging film 20 is omitted.

Since this packaging product 40 includes the packaging container 30, and the packaging container 30 has good appearance and barrier performance, visibility of the contents is excellent, and reduction in quality of the contents C caused by ingress of oxygen can be suppressed for a long period.

It is noted that the packaging container 30 can also be obtained by folding one packaging film 20 and heat-sealing marginal portions of the packaging film 20 with sealant layers 21 facing each other.

Examples of the packaging container 30 include a packaging bag, a laminated tube container, and a liquid paper container.

The contents C are not particularly limited, and examples of the contents C include food products, liquid, pharmaceutical products, and electronic components.

The present disclosure is not limited to the above-described embodiments. For example, the sealant layer 21 is disposed on the gas barrier coating layer 4 side of the substrate layer 1 of the gas barrier laminate 10 in the packaging film 20 according to the above-described embodiment, but the sealant layer 21 may be disposed on a side opposite the gas barrier coating layer 4 of the substrate layer 1.

SUMMARY OF THE EMBODIMENTS

[1]

A method of producing a gas barrier laminate, including:

a step of forming, on a substrate layer containing a polypropylene resin or a polyester resin, a metal oxide layer by a vacuum film forming process;

a step of applying a gas barrier coating layer-forming composition on the metal oxide layer to form a coating film;

a step of preheating the coating film by infrared radiation; and a step of heating and accordingly curing the coating film preheated by infrared radiation in an atmosphere of 50 to 120° C. to form a gas barrier coating layer, in which the gas barrier coating layer-forming composition contains at least one selected from the group consisting of an alkyl silicon alkoxide and its hydrolysate, and a water-soluble polymer.

[2]

The production method according to [1], in which the gas barrier coating layer-forming composition further contains a silane coupling agent.

[3]

A gas barrier laminate including a substrate layer containing a polypropylene resin or a polyester resin, a metal oxide layer, and a gas barrier coating layer, in this order, in which the gas barrier coating layer has a hardness of 0.15 GPa or more and less than 1.10 GPa as measured by a nanoindentation method.

[4]

The gas barrier laminate according to [3], in which the gas barrier coating layer has a composite modulus of elasticity of 11 GPa or less.

[5]

The gas barrier laminate according to [3] or [4], further including an anchor coat layer between the substrate layer and the metal oxide layer.

[6]

The gas barrier laminate according to any one of [3] to [5], in which the metal oxide layer contains at least one of an aluminum oxide and a silicon oxide.

[7]

A packaging film including the gas barrier laminate according to any one of [3] to [6] and a sealant layer.

[8]

A packaging container including the packaging film according to [7].

[9]

A packaging product including the packaging container according to [8] and contents filled in the packaging container.

EXAMPLES

Hereinafter, the present disclosure will be specifically described by way of examples. However, the present disclosure is not limited to these examples.

<Preparation of Coating Liquid>

Coating liquids 1 to 2 as a gas barrier coating layer-forming composition used in examples were prepared in the following manner.

(Coating Liquid 1)

Liquids A to C below were mixed to obtain a coating liquid 1. The coating liquid 1 was prepared such that when the solid content was 100, a mass ratio between TEOS (value converted into $SiO_2$), a PVA, and an isocyanurate silane (value converted into $R^2Si(OH)_3$) was 68/27/5.

Liquid A: a solution (5 mass % (converted into $SiO_2$) hydrolyzed solution of TEOS) obtained by mixing 17.9 g of tetraethoxysilane (trade name: KBE04, solid content: 100%, manufactured by Shin-Etsu Chemical Co., Ltd., also referred to as "TEOS") as an alkyl silicon alkoxide, 10 g of methanol (Kanto Chemical Co., Inc.), and 72.1 g of a 0.1 N hydrochloric acid (manufactured by Kanto Chemical Co., Inc.), and hydrolyzing the mixture.

Liquid B: a 5 mass % aqueous solution of polyvinyl alcohol (trade name: Kuraray POVAL 60-98, manufactured by KURARAY Company, also referred to as "PVA").

Liquid C: a solution obtained by diluting and adjusting 1,3,5-tris(3-methoxysilylpropyl) isocyanurate (trade name: X-12-965P, manufactured by Shin-Etsu Chemical Co., Ltd.) as a silane coupling agent (SC agent) with a mixed solution having a mass ratio of water/IPA=1/1 such that the ratio of the solid content was 5% (mass ratio, converted into $R^2Si(OH)_3$).

(Coating Liquid 2)

The above-described liquids A to C were mixed to obtain a coating liquid 2. The coating liquid 2 was prepared such that when the solid content was 100, a mass ratio between the TEOS (value converted into $SiO_2$), PVA, and isocyanurate silane (value converted into $R^2Si(OH)_3$) was 47.6/47.6/4/4.8.

<Preparation of Anchor Coat Layer-Forming Composition>

An anchor coat layer-forming composition was prepared in the following manner.

Acrylic polyol was mixed with tolylene diisocyanate so that the number of NCO groups in the tolylene diisocyanate became equivalent to the number of OH groups in the acrylic polyol. The mixture was diluted with ethyl acetate such that the solid content (total amount of acrylic polyol and tolylene diisocyanate) was 5 mass %. To the mixed solution after dilution, β-(3,4epoxycyclohexyl)trimethoxysilane was further added in an amount of 5 parts by mass relative to 100 parts by mass in total of acrylic polyol and tolylene diisocyanate, and these were mixed to prepare an anchor coat layer-forming composition (anchor coat agent).

<Preparation of Gas Barrier Laminate: Experiment A (PP)>

Example A-1

A gas barrier laminate was prepared by a roll-to-roll process in the following manner. First, a polypropylene resin film (trade name "U-1", biaxially stretched film: OPP, manufactured by Mitsui Chemicals Tohcello Inc.) as a substrate layer having a thickness of 20 μm was mounted on an unwinding device, a conveying device, and a winding device.

Next, one surface of the substrate layer while being conveyed was coated with the anchor coat layer-forming composition prepared as described above by a gravure coating process to form a coating film. Then, the coating film was heated and dried at 120° C. for 10 seconds to form an anchor coat layer (AC layer) having a thickness of 50 nm and obtain a laminate. The thus obtained laminate was wound by the winding device to obtain a roll-like laminate.

Next, the roll-like laminate was mounted on an unwinding device, a conveying device, and a winding device. Then, the laminate was fed from the roll-like laminate, and an $SiO_x$ film (metal oxide layer) having a thickness of 20 nm was formed on the anchor coat layer of the laminate while being conveyed. In formation of the $SiO_x$ film, a vacuum vapor deposition device of an electron beam heating system was used to evaporate silicon dioxide by electron beam heating.

The coating liquid 1 was applied on this $SiO_x$ film to form a coating film. The formed coating film was preheated by far-infrared radiation using a far-infrared heater under the conditions of preheating temperature: 50° C. and time: 5 seconds. The conditions of the far-infrared heater were center wavelength: 6 μm, ceramic temperature: 203° C., and emissivity: 0.93.

The coating film preheated by infrared radiation was further heated and dried using a shot nozzle type dryer under the conditions (60 seconds in an atmosphere at 60° C.) illustrated in Table 1 to form a gas barrier coating layer having a thickness of 300 nm. The heating was performed so as to remove liquid in the coating liquid 1 while curing the TEOS, PVA, and isocyanurate silane constituting the solid content in the coating liquid 1 to form a cured body.

In the above-described manner, a gas barrier laminate in which a substrate layer, an anchor coat layer, a metal oxide layer, and a gas barrier coating layer are laminated in this order was obtained.

Examples A-2, A-4, and A-5

A gas barrier laminate was obtained in the same manner as in Example A-1, except that the thickness and drying conditions of the barrier coating layer were as illustrated in Table 1.

Example A-3

A gas barrier laminate in which a substrate layer, a metal oxide layer, and a gas barrier coating layer are laminated in this order was obtained by laminating the layers in the same manner as in Example A-1, except that one surface of the substrate layer was subjected to a surface treatment without forming an anchor coat layer. The surface treatment was performed by performing a plasma treatment by glow discharge (power 350 W) to the surface of the substrate layer in a vacuum device. The treatment atmosphere was oxygen gas (10 Pa).

Example A-6

A gas barrier laminate was obtained in the same manner as in Example A-1, except that an $AlO_x$ film (metal oxide layer) having a thickness of 15 nm was formed on the anchor coat layer. The $AlO_x$ film was formed by introducing oxygen such that the pressure became $1.2\times10^{-2}$ Pa, while evaporating an aluminum ingot by electron beam heating using a vacuum deposition device of an electron beam heating system.

Example A-7

A gas barrier laminate was obtained in the same manner as in Example A-6, except that the thickness and drying conditions of the barrier coating layer were as illustrated in Table 1.

Examples A-8 and A-9

A gas barrier laminate was obtained in the same manner as in Example A-1, except that the coating liquid 2 was used in place of the coating liquid 1, and the thickness and drying conditions of the barrier coating layer were as illustrated in Table 1.

Examples A-10 and A-11

A gas barrier laminate was obtained in the same manner as in Example A-6, except that the coating liquid 2 was used in place of the coating liquid 1, and the thickness and drying conditions of the barrier coating layer were as illustrated in Table 1.

Comparative Examples A-1 and A-3

A gas barrier laminate was obtained in the same manner as in Example A-1, except that far-infrared heating was not performed on the barrier coating layer, and the thickness and drying conditions of the barrier coating layer were as illustrated in Table 1.

Comparative Examples A-2 and A-4

A gas barrier laminate was obtained in the same manner as in Example A-1, except that the coating liquid 2 was used in place of the coating liquid 1, far-infrared heating was not performed on the barrier coating layer, and the thickness and drying conditions of the barrier coating layer were as illustrated in Table 1.

<Preparation of Gas Barrier Laminate: Experiment B (PET)>

Example B-1

A gas barrier laminate was prepared by a roll-to-roll process in the following manner. First, a 12 μm-thick polyethylene terephthalate (PET) film (trade name "P60": manufactured by Toray Industries, Inc.) as the substrate layer was mounted on an unwinding device, a conveying device, and a winding device.

Next, one surface of the substrate layer was subjected to surface treatment while being conveyed. The surface treatment was performed by performing a plasma treatment by glow discharge (power 350 W) to the surface of the substrate layer in a vacuum device. The treatment atmosphere was oxygen gas (10 Pa). This was wound by the winding device to obtain a roll-like PET film subjected to a surface treatment.

Next, the roll-like PET film was mounted on an unwinding device, a conveying device, and a winding device. Then, the PET film was fed from the roll-like PET film, and an $SiO_x$ film (metal oxide layer) having a thickness of 20 nm was formed on a surface subjected to the surface treatment of the PET film while being conveyed. In formation of the $SiO_x$ film, a vacuum vapor deposition device of an electron beam heating system was used to evaporate silicon dioxide by electron beam heating.

The coating liquid 1 was applied on this $SiO_x$ film to form a coating film. The formed coating film was preheated by far-infrared radiation using a far-infrared heater under the conditions of preheating temperature: 50° C. and time: 5 seconds. The conditions of the far-infrared heater were center wavelength: 6 μm, ceramic temperature: 203° C., and emissivity: 0.93.

The coating film preheated by infrared radiation was further heated and dried using a shot nozzle type dryer under conditions (60 seconds in an atmosphere at 80° C.) illustrated in Table 2 to form a gas barrier coating layer having a thickness of 300 nm. The heating was performed so as to remove liquid in the coating liquid 1 while curing the TEOS, PVA, and isocyanurate silane constituting the solid content in the coating liquid 1 to form a cured body.

In the above-described manner, a gas barrier laminate in which the substrate layer, the metal oxide layer, and the gas barrier coating layer are laminated in this order was obtained.

Example B-2

An anchor coat layer was formed without performing a surface treatment. Specifically, the anchor coat layer-forming composition prepared as described above by a gravure coating process was applied on one surface of the substrate layer while being conveyed to form a coating film. Then, the coating film was heated and dried at 120° C. for 10 seconds to form an anchor coat layer (AC layer) having a thickness of 50 nm and obtain a laminate. The thus obtained laminate was wound by the winding device to obtain a roll-like laminate. Thereafter, the obtained roll-like laminate was used to laminate layers in the same manner as in Example B-1 thereby to obtain a gas barrier laminate in which a substrate layer, an anchor coat layer, a metal oxide layer, and a gas barrier coating layer were laminated in this order.

Example B-3

A gas barrier laminate was obtained in the same manner as in Example B-2, except that an $AlO_x$ film (metal oxide layer) having a thickness of 15 nm was formed on the anchor coat layer. The $AlO_x$ film was formed by introducing oxygen such that the pressure became $1.2\times10^{-2}$ Pa, while evaporating an aluminum ingot by electron beam heating using a vacuum deposition device of an electron beam heating system.

Example B-4

A gas barrier laminate was obtained in the same manner as in Example B-3, except that the thickness and drying conditions of the barrier coating layer were as illustrated in Table 2.

Example B-5

A gas barrier laminate was obtained in the same manner as in Example B-3, except that the PET film was replaced by a 15 μm-thick polybutylene terephthalate (PBT) film (trade name "BOBLET ST": manufactured by KOHJIN Film & Chemicals Co., Ltd.) as the substrate layer, and the drying conditions of the barrier coating layer were as illustrated in Table 2.

Example B-6

A gas barrier laminate was obtained in the same manner as in Example B-3, except that the PET film was replaced by a 12 μm-thick polyethylene naphthalate (PEN) film (trade name "TEONEX Q51": manufactured by Toyobo Co., Ltd.) as the substrate layer, and the drying conditions of the barrier coating layer were as illustrated in Table 2.

Comparative Examples B-1 and B-3

A gas barrier laminate was obtained in the same manner as in Example B-3, except that far-infrared heating was not performed on the barrier coating layer, and the thickness and drying conditions of the barrier coating layer were as illustrated in Table 2.

Comparative Example B-2

A gas barrier laminate was obtained in the same manner as in Example B-1, except that an $AlO_x$ film (metal oxide layer) was formed in the same manner as in Example B-3, far-infrared heating was not performed on the barrier coating layer, and the thickness and drying conditions of the barrier coating layer were as illustrated in Table 2.

<Measurement of Hardness and Composite modulus of elasticity of Gas Barrier Coating Layer>

The hardness and composite modulus of elasticity of the gas barrier coating layer of the gas barrier laminate obtained in each example were measured by a nanoindentation method in the following manner.

A measurement sample (cross-section sample) was prepared in the following manner. That is, both surfaces of the gas barrier laminate were subjected to a corona treatment and thereafter embedded in a visible light curing resin D-800. Then, an ultramicrotome Leica EM UC7 was used to vertically cut the gas barrier laminate in the laminated direction by a diamond knife MicroStar LH.

The exposed cross section was subjected to a finishing treatment under the conditions of a cutting thickness Feed of 100 nm and a cutting speed of 1 mm/s to obtain a measurement sample.

Measurement was performed using a Hysitron TI-Premier (trade name) manufactured by Bruker Japan K.K as a measurement device and a Berkovich type diamond indenter manufactured by Bruker Japan K.K. as an indenter. Measurement conditions were as follows.

Temperature: normal temperature (25° C.)

Mode: load control mode

Indenting and unloading: indenting at an indentation rate of 1.5 μN/sec to a load of 15 μN, thereafter maintaining the maximum load for 5 seconds, and thereafter unloading at a rate of 1.5 μN/sec.

Measurement location: obtaining a shape image of the cross section of the gas barrier coating layer by a shape measuring function of a measurement device for scanning the surface of a sample with an indenter, and selecting 20 locations at intervals of 1 μm or more on the cross section of the gas barrier coating layer from the shape image.

In calculating the hardness and composite modulus of elasticity, fused quartz was used as a reference sample to previously calibrate the relationship between the contact depth and the contact projected area of the indenter and the sample. Thereafter, an unloading curve in the region of 60 to 95% with respect to the maximum load during unloading is analyzed by an Oliver-Pharr method to calculate the hardness and composite modulus of elasticity of the gas barrier coating layer. Results are illustrated in Tables 1 and 2.

<Evaluation of Gas Barrier Laminate>

(1) Appearance Test

The appearance test of the gas barrier laminate obtained in each example was performed. Specifically, the gas barrier laminate was processed into a size of 1 m×100 m, and the processed laminate was thereafter randomly cut into ten 10 cm-square samples. The sample was rated as "Poor" when wrinkles were visually confirmed in even one of the ten samples, and as "Good" when no wrinkles were visually confirmed in any of the ten samples. Results are illustrated in Tables 1 and 2.

(2) Preparation of Laminated Film

A 60 μm-thick unstretched polypropylene film (CPP, trade name "TORAYFAN ZK207", manufactured by Toray Advanced Film Co., Ltd.) was adhered to the surface of the gas barrier coating layer of the gas barrier laminate obtained in each example using a two-component adhesive agent (trade name "TAKELAC A-525/TAKENATE A-52", manufactured by Mitsui Chemicals, Inc.) to prepare a laminated film having a surface width of 210 mm.

(3) Measurement of Oxygen Permeability

Using an oxygen permeability measuring device (product name "OX-TRAN 2/20", manufactured by MOCON, Inc.), the oxygen permeability (unit: cc/m$^2$·day·atm) of the above-described laminated film under the conditions of a temperature of 30° C. and a relative humidity of 70% was measured as initial oxygen permeability (before retort). The measurement was performed in accordance with JIS K-7126-2. Results are illustrated in Tables 1 and 2.

(4) Oxygen Barrier Properties after Retort Treatment (Preparation of Test Sample)

Using the laminated film prepared in the above-described manner, a three-sided pouch having an opening was prepared. The three-sided pouch was formed by folding the laminated film such that the unstretched polypropylene films face each other, and heat-sealing the unstretched polypropylene films with each other. Then, tap water (city water) was charged through an opening, and the opening of the three-sided pouch was sealed thereby to prepare a sealed body as a test sample.

(Retort Treatment)

The test sample obtained in the above-described manner was subjected to a heat treatment (retort treatment) at 121° C. for 30 minutes. Then, the oxygen permeability (after retort) after a retort treatment was measured in the same manner as in the above-described measurement of initial oxygen permeability. Results are illustrated in Tables 1 and 2.

(5) Oxygen Barrier Properties after Abuse

Abuse was performed on the above-described laminated film by performing a bending test (Gelbo Flex test) and a stretching test in the following manner, and the oxygen permeability after abuse (after Gelbo) was measured in the same manner as in the above-described measurement of initial oxygen permeability. Results are illustrated in Tables 1 and 2.

(Bending Test)

A test sample of 297 mm in height×210 mm in width was cut out from the above-described laminated film, and this test sample was attached to a fixing head of a Gelbo Flex tester (manufactured by Tester Sangyo Co., Ltd.) in such a manner as to have a cylindrical shape of 87.5 mm in diameter×210 mm thereby to prepare a cylindrical body. Then, both ends of the cylindrical body were held, and a reciprocating motion repeating an action of applying a 440 degree twist, with a setting of an initial grip interval of 175 mm and a stroke of 87.5 mm was performed at a speed of 40 actions/minute ten times to thereby bend the cylindrical body.

TABLE 1

| | | | Gas barrier coating layer | | | | | | | Oxygen permeability ($cc/m^2$ day atm) | | |
|---|---|---|---|---|---|---|---|---|---|---|---|---|
| Experiment A (PP) | Substrate layer | AC layer | Metal oxide layer | Coating liquid | Thickness (nm) | Drying condition | Hardness (GPa) | Complex modulus (GPa) | Appearance | Before retort | After retort | After Gelbo |
| Example 1 | OPP | Included | $SiO_x$ | 1 | 300 | 80° C. 60 sec | 0.61 | 6.8 | Good | 0.2 | 1.7 | 12.8 |
| Example 2 | OPP | Included | $SiO_x$ | 1 | 380 | 60° C. 60 sec | 0.48 | 4.4 | Good | 0.2 | 1.6 | 9.7 |
| Example 3 | OPP | Not included (surface treatment) | $SiO_x$ | 1 | 300 | 80° C. 60 sec | 0.78 | 7.1 | Good | 0.4 | 2.4 | 17.5 |
| Example 4 | OPP | Included | $SiO_x$ | 1 | 300 | 80° C. 60 sec | 0.76 | 6.9 | Good | 0.2 | 1.7 | 16.3 |
| Example 5 | OPP | Included | $SiO_x$ | 1 | 280 | 120° C. 60 sec | 1.09 | 11.2 | Good | 0.1 | 1.8 | 18.5 |
| Example 6 | OPP | Included | $AlO_x$ | 1 | 280 | 80° C. 60 sec | 0.80 | 7.9 | Good | 0.2 | 1.6 | 17.7 |
| Example 7 | OPP | Included | $AlO_x$ | 1 | 280 | 120° C. 60 sec | 1.06 | 10.4 | Good | 0.2 | 1.9 | 18 |
| Example 8 | OPP | Included | $SiO_x$ | 2 | 300 | 60° C. 60 sec | 0.15 | 2.7 | Good | 0.1 | 1.3 | 10.4 |
| Example 9 | OPP | Included | $SiO_x$ | 2 | 300 | 80° C. 60 sec | 0.30 | 4.3 | Good | 0.1 | 1.6 | 12.7 |
| Example 10 | OPP | Included | $AlO_x$ | 2 | 300 | 60° C. 60 sec | 0.15 | 2.8 | Good | 0.2 | 1.5 | 11.4 |
| Example 11 | OPP | Included | $AlO_x$ | 2 | 300 | 80° C. 60 sec | 0.34 | 4.8 | Good | 0.2 | 1.8 | 13.6 |
| Comparative Example 1 | OPP | Included | $SiO_x$ | 1 | 300 | 140° C. 60 sec | 1.47 | 11.9 | Poor | 0.6 | 1.8 | 25.7 |
| Comparative Example 2 | OPP | Included | $SiO_x$ | 2 | 280 | 140° C. 30 sec | 1.20 | 12.5 | Poor | 0.4 | 1.9 | 23.8 |
| Comparative Example 3 | OPP | Included | $SiO_x$ | 1 | 280 | 120° C. 60 sec | 1.15 | 11.7 | Good | 0.3 | 2.3 | 21.5 |
| Comparative Example 4 | OPP | Included | $SiO_x$ | 2 | 300 | 80° C. 60 sec | 0.13 | 3.8 | Good | 0.2 | 2.4 | 19.7 |

*No far-infrared heating in Comparative Examples 1 to 4.

TABLE 2

| | | | Gas barrier coating layer | | | | | | Oxygen permeability ($cc/m^2$ day atm) | | |
|---|---|---|---|---|---|---|---|---|---|---|---|
| Experiment B (PET) | Substrate layer | AC layer | Metal oxide layer | Thickness (nm) | Drying condition | Hardness (GPa) | Complex modulus (GPa) | Appearance | Before retort | After retort | After Gelbo |
| Example 1 | PET | Not included (surface treatment) | $SiO_x$ | 300 | 80° C. 60 sec | 0.81 | 8.4 | Good | 0.2 | 0.2 | 0.3 |
| Example 2 | PET | Included | $SiO_x$ | 300 | 80° C. 60 sec | 0.80 | 8.2 | Good | 0.1 | 0.2 | 0.3 |
| Example 3 | PET | Included | $AlO_x$ | 300 | 80° C. 60 sec | 0.84 | 8.8 | Good | 0.1 | 0.1 | 0.3 |
| Example 4 | PET | Included | $AlO_x$ | 250 | 120° C. 60 sec | 1.08 | 9.4 | Good | 0.1 | 0.1 | 0.2 |
| Example 5 | PBT | Included | $AlO_x$ | 300 | 120° C. 60 sec | 0.99 | 9.2 | Good | 0.2 | 0.2 | 0.4 |

TABLE 2-continued

| Experiment B (PET) | Substrate layer | AC layer | Metal oxide layer | Gas barrier coating layer Thickness (nm) | Drying condition | Hardness (GPa) | Complex modulus (GPa) | Appearance | Oxygen permeability (cc/m$^2$ day atm) Before retort | After retort | After Gelbo |
|---|---|---|---|---|---|---|---|---|---|---|---|
| Example 6 | PEN | Included | $AlO_x$ | 300 | 120° C. 60 sec | 0.97 | 9.3 | Good | 0.1 | 0.1 | 0.3 |
| Comparative Example 1 | PET | Included | $AlO_x$ | 300 | 130° C. 30 sec | 1.15 | 11.8 | Poor | 0.1 | 0.1 | 0.2 |
| Comparative Example 2 | PET | Not included (surface treatment) | $AlO_x$ | 300 | 140° C. 30 sec | 1.28 | 12.5 | Poor | 0.1 | 0.2 | 0.3 |
| Comparative Example 3 | PET | Included | $AlO_x$ | 300 | 150° C. 60 sec | 1.50 | 13.7 | Poor | 0.1 | 0.1 | 0.3 |

*No far-infrared heating in Comparative Examples 1 to 3.

As illustrated in Tables 1 and 2, occurrence of wrinkling in the substrate layer is suppressed, and cracking tended to be suppressed in the gas barrier coating layer, in the gas barrier laminates of Examples compared to in the gas barrier laminates of Comparative Examples. That is, it can be said that the gas barrier laminates of Examples are gas barrier laminates having good appearance and barrier performance.

REFERENCE SIGNS LIST

1 . . . Substrate layer;
3 . . . Metal oxide layer;
4 . . . Gas barrier coating layer;
10 . . . Gas barrier laminate;
20 . . . Packaging film;
21 . . . Sealant layer;
30 . . . Packaging container;
40 . . . Packaging product.

What is claimed is:

1. A gas barrier laminate, comprising:
a substrate layer consisting of a polypropylene resin, a metal oxide layer, and a gas barrier coating layer, in this order,
wherein the gas barrier coating layer has a hardness of 0.15 GPa or more and 0.7 GPa or less as measured by a nanoindentation method.

2. The gas barrier laminate of claim 1, wherein the gas barrier coating layer has a composite modulus of elasticity of 11 GPa or less.

3. The gas barrier laminate of claim 1, further comprising an anchor coat layer between the substrate layer and the metal oxide layer.

4. The gas barrier laminate of claim 1, wherein the metal oxide layer contains at least one of an aluminum oxide and a silicon oxide.

5. The gas barrier laminate of claim 1, wherein the gas barrier coating layer is a cured product of a composition containing at least one selected from the group consisting of an alkyl silicon alkoxide and its hydrolysate, and a water-soluble polymer.

6. The gas barrier laminate of claim 5, wherein the gas barrier coating layer has a thickness of 200 nm to 400 nm.

7. The gas barrier laminate of claim 5, wherein:
(a) the substrate layer has a thickness of 12 μm to 30 μm;
(b) the metal oxide layer comprises silicon oxide and has a thickness of 10 nm to 60 nm;
(c) the gas barrier coating layer has a thickness of 200 nm to 400 nm;
(d) an anchor coat layer is disposed between the substrate layer and the metal oxide layer, the anchor coat layer having a thickness of 30 nm to 200 nm; and
(e) the gas barrier coating layer has a hardness of 0.20 GPa to 0.70 GPa and a composite modulus of elasticity of 2 GPa to 6 GPa.

8. A packaging film comprising the gas barrier laminate of claim 1 and a sealant layer.

9. A packaging container comprising the packaging film of claim 8.

10. A packaging product comprising the packaging container of claim 9 and contents filled in the packaging container.

11. A gas barrier laminate, comprising:
a substrate layer consisting of a polypropylene resin, a metal oxide layer, and a gas barrier coating layer, in this order,
wherein the gas barrier coating layer has a hardness of 0.15 GPa or more and less than 1.10 GPa as measured by a nanoindentation method and
the gas barrier coating layer has a composite modulus of elasticity of 7.0 GPa or less.

12. The gas barrier laminate of claim 11, further comprising an anchor coat layer between the substrate layer and the metal oxide layer.

13. The gas barrier laminate of claim 11, wherein the metal oxide layer contains at least one of an aluminum oxide and a silicon oxide.

14. The gas barrier laminate of claim 11, wherein the gas barrier coating layer is a cured product of a composition containing at least one selected from the group consisting of an alkyl silicon alkoxide and its hydrolysate, and a water-soluble polymer.

15. A packaging film comprising the gas barrier laminate of claim 11 and a sealant layer.

16. A packaging container comprising the packaging film of claim 15.

17. A packaging product comprising the packaging container of claim 16 and contents filled in the packaging container.

* * * * *